United States Patent
Wigdor (10) Patent No.: US 7,721,968 B2
(45) Date of Patent: *May 25, 2010

(54) CONCURRENT DATA ENTRY FOR A PORTABLE DEVICE

(75) Inventor: Daniel Wigdor, Toronto (CA)

(73) Assignee: Iota Wireless, LLC, Chicago, IL (US)

( * ) Notice: Subject to any disclaimer, the term of this patent is extended or adjusted under 35 U.S.C. 154(b) by 859 days.

This patent is subject to a terminal disclaimer.

(21) Appl. No.: 10/560,765

(22) PCT Filed: Nov. 1, 2004

(86) PCT No.: PCT/US2004/036179

§ 371 (c)(1),
(2), (4) Date: May 15, 2006

(87) PCT Pub. No.: WO2005/043332

PCT Pub. Date: May 12, 2005

(65) Prior Publication Data

US 2007/0186192 A1    Aug. 9, 2007

Related U.S. Application Data

(60) Provisional application No. 60/516,385, filed on Oct. 31, 2003.

(51) Int. Cl.
| | |
|---|---|
| *G06K 7/10* | (2006.01) |
| *G09G 5/00* | (2006.01) |
| *G06F 3/033* | (2006.01) |
| *G01C 9/00* | (2006.01) |
| *G01C 17/00* | (2006.01) |
| *G01C 19/00* | (2006.01) |

(52) U.S. Cl. .............. 235/472.01; 345/169; 341/22; 715/863; 702/150

(58) Field of Classification Search ............ 235/472.01; 345/168, 169, 158; 341/22; 715/863, 864; 702/150

See application file for complete search history.

(56) References Cited

U.S. PATENT DOCUMENTS 5,586,182 A    12/1996    Miyashita ................ 379/413
5,602,566 A *  2/1997    Motosyuku et al. ......... 345/684

(Continued)

FOREIGN PATENT DOCUMENTS

EP           1 104 143 A2    5/2001

(Continued)

OTHER PUBLICATIONS

International Search Report for PCT/US04/36179 dated Nov. 1, 2004.
Unpublished U.S. Appl. No. 10/987,333, filed Nov. 12, 2004.
Partridge et al., "TiltType: Accelerometer-Supported Text Entry for Very Small Devices," vol. 4, Issue 2, Oct. 27, 2002, pp. 201-204.

(Continued)

*Primary Examiner*—Daniel Walsh
(74) *Attorney, Agent, or Firm*—McDonnell Boehnen Hulbert & Berghoff LLP (57) ABSTRACT

A system and method for entering data on a portable device includes determining a tilt state (tilt sensor 304) as a button (keypad 306) is being pressed. The determined tilt state can be used to disambiguate from among a plurality of characters associated with the pressed button. In a preferred embodiment, the portable device is a mobile phone and the button is part of a standard 12-button keypad.

11 Claims, 7 Drawing Sheets

U.S. PATENT DOCUMENTS

| | | | | |
|---|---|---|---|---|
| 5,758,267 | A * | 5/1998 | Pinder et al. | 455/90.2 |
| 5,818,437 | A * | 10/1998 | Grover et al. | 715/811 |
| 5,966,671 | A | 10/1999 | Mitchell et al. | 455/575 |
| 6,031,471 | A | 2/2000 | Wilson | 341/22 |
| 6,052,070 | A | 4/2000 | Kivela et al. | 341/22 |
| 6,060,969 | A | 5/2000 | Hufgard et al. | 335/207 |
| 6,115,028 | A | 9/2000 | Balakrishnan et al. | 345/157 |
| 6,201,554 | B1 * | 3/2001 | Lands | 345/169 |
| 6,347,290 | B1 * | 2/2002 | Bartlett | 702/150 |
| 6,349,220 | B1 | 2/2002 | Prior et al. | 455/566 |
| 6,384,827 | B1 * | 5/2002 | Dawkins | 345/467 |
| 6,433,793 | B1 * | 8/2002 | Ootsuka | 345/684 |
| 6,449,363 | B1 * | 9/2002 | Kielsnia | 379/420.01 |
| 6,470,264 | B2 | 10/2002 | Bide | 701/207 |
| 6,529,144 | B1 | 3/2003 | Nilsen et al. | 341/20 |
| 6,554,191 | B2 | 4/2003 | Yoneya | 235/472.01 |
| 6,570,583 | B1 * | 5/2003 | Kung et al. | 345/661 |
| 6,573,883 | B1 * | 6/2003 | Bartlett | 345/156 |
| 6,593,914 | B1 | 7/2003 | Nuovo et al. | 345/169 |
| 6,597,345 | B2 * | 7/2003 | Hirshberg | 345/168 |
| 6,624,824 | B1 | 9/2003 | Tognazzini et al. | 345/684 |
| 6,728,395 | B1 * | 4/2004 | Kage et al. | 382/107 |
| 6,731,227 | B2 * | 5/2004 | Horie | 341/22 |
| 6,805,506 | B2 * | 10/2004 | Bar-Yona | 400/485 |
| 6,809,661 | B1 | 10/2004 | Badarneh | 341/31 |
| 6,847,351 | B2 | 1/2005 | Noguerra | 345/158 |
| 6,882,335 | B2 | 4/2005 | Saarinen | 345/156 |
| 6,894,681 | B2 * | 5/2005 | D'Agostini | 345/173 |
| 6,933,923 | B2 * | 8/2005 | Feinstein | 345/158 |
| 6,957,088 | B2 * | 10/2005 | Kato et al. | 455/566 |
| 6,998,966 | B2 | 2/2006 | Pedersen et al. | 340/384.1 |
| 7,075,520 | B2 * | 7/2006 | Williams | 345/169 |
| 7,301,528 | B2 * | 11/2007 | Marvit et al. | 345/156 |
| 7,389,591 | B2 * | 6/2008 | Jaiswal et al. | 33/366.11 |
| 7,562,459 | B2 * | 7/2009 | Fourquin et al. | 33/366.11 |
| 2001/0048423 | A1 * | 12/2001 | Rekimoto | 345/157 |
| 2002/0021278 | A1 | 2/2002 | Hinckley et al. | 345/156 |
| 2002/0027549 | A1 | 3/2002 | Hirshberg | 345/168 |
| 2002/0033836 | A1 | 3/2002 | Smith | 345/649 |
| 2002/0060699 | A1 * | 5/2002 | D'Agostini | 345/783 |
| 2002/0061735 | A1 * | 5/2002 | Wingett et al. | 455/90 |
| 2002/0075335 | A1 * | 6/2002 | Rekimoto | 345/864 |
| 2002/0093483 | A1 | 7/2002 | Kaplan | 345/158 |
| 2002/0140679 | A1 * | 10/2002 | Wen | 345/168 |
| 2002/0163504 | A1 | 11/2002 | Pallakoff | 345/169 |
| 2002/0175896 | A1 | 11/2002 | Vaananen et al. | 345/158 |
| 2002/0198029 | A1 | 12/2002 | Tenhunen et al. | 455/566 |
| 2003/0001816 | A1 * | 1/2003 | Badarneh | 345/156 |
| 2003/0003976 | A1 | 1/2003 | Mura | 463/1 |
| 2003/0038778 | A1 * | 2/2003 | Noguera | 345/157 |
| 2003/0044000 | A1 * | 3/2003 | Kfoury et al. | 379/433.04 |
| 2003/0045274 | A1 * | 3/2003 | Nishitani | 455/414 |
| 2003/0048262 | A1 | 3/2003 | Wu et al. | 345/713 |
| 2003/0083107 | A1 | 5/2003 | Morishima | 455/566 |
| 2003/0090467 | A1 | 5/2003 | Hohl et al. | 345/168 |
| 2003/0095155 | A1 | 5/2003 | Johnson | 348/864 |
| 2003/0107500 | A1 | 6/2003 | Lee | 341/22 |
| 2003/0107555 | A1 * | 6/2003 | Williams | 345/169 |
| 2003/0134665 | A1 * | 7/2003 | Kato et al. | 455/566 |
| 2004/0098266 | A1 * | 5/2004 | Hughes et al. | 704/277 |
| 2004/0125073 | A1 * | 7/2004 | Potter et al. | 345/156 |
| 2004/0130524 | A1 * | 7/2004 | Matsui | 345/156 |
| 2004/0145613 | A1 | 7/2004 | Stavely et al. | 345/863 |
| 2004/0253931 | A1 * | 12/2004 | Bonnelykke et al. | 455/90.3 |
| 2005/0078086 | A1 | 4/2005 | Grams et al. | 345/158 |
| 2005/0110778 | A1 | 5/2005 | Ben Ayed | 345/179 |
| 2005/0114788 | A1 * | 5/2005 | Fabritius | 715/767 |
| 2005/0116941 | A1 | 6/2005 | Wallington | 345/184 |
| 2005/0151448 | A1 | 7/2005 | Hikida et al. | 310/338 |
| 2005/0154798 | A1 | 7/2005 | Nurmi | 710/1 |
| 2005/0192741 | A1 | 9/2005 | Nichols et al. | 701/207 |
| 2005/0195952 | A1 | 9/2005 | Dyer et al. | 379/201.01 |
| 2005/0197145 | A1 * | 9/2005 | Chae et al. | 455/517 |
| 2005/0212754 | A1 * | 9/2005 | Marvit et al. | 345/156 |
| 2005/0212757 | A1 * | 9/2005 | Marvit et al. | 345/156 |
| 2005/0245203 | A1 | 11/2005 | Vance | 455/79 |
| 2005/0246109 | A1 | 11/2005 | Bang et al. | 702/41 |
| 2005/0247548 | A1 * | 11/2005 | Levy | 200/5 R |
| 2006/0007128 | A1 * | 1/2006 | Fux et al. | 345/156 |
| 2006/0017692 | A1 | 1/2006 | Wehrenberg et al. | 345/156 |
| 2006/0052109 | A1 * | 3/2006 | Ashman et al. | 455/440 |
| 2006/0094480 | A1 * | 5/2006 | Tanaka | 455/575.1 |
| 2006/0103631 | A1 * | 5/2006 | Mashima et al. | 345/158 |
| 2006/0146009 | A1 * | 7/2006 | Syrbe et al. | 345/156 |
| 2006/0255139 | A1 * | 11/2006 | Lee et al. | 235/439 |
| 2006/0260397 | A1 * | 11/2006 | Kim et al. | 73/488 |
| 2006/0281453 | A1 * | 12/2006 | Jaiswal et al. | 455/423 |
| 2006/0284855 | A1 * | 12/2006 | Shintome | 345/173 |
| 2007/0103431 | A1 * | 5/2007 | Tabatowski-Bush | 345/156 |
| 2007/0139359 | A1 * | 6/2007 | Voelckers | 345/156 |
| 2007/0180718 | A1 * | 8/2007 | Fourquin et al. | 33/366.11 |
| 2007/0186192 | A1 * | 8/2007 | Wigdor | 715/864 |
| 2007/0242041 | A1 * | 10/2007 | Kuroume et al. | 345/158 |
| 2007/0252729 | A1 * | 11/2007 | Li et al. | 341/22 |
| 2007/0259685 | A1 * | 11/2007 | Engblom et al. | 455/550.1 |
| 2007/0270178 | A1 * | 11/2007 | Sohn et al. | 455/550.1 |
| 2007/0282468 | A1 * | 12/2007 | Tsujino et al. | 700/83 |
| 2008/0012822 | A1 * | 1/2008 | Sakhpara | 345/156 |
| 2008/0235965 | A1 * | 1/2008 | Jaiswal et al. | 33/366.11 |
| 2008/0062015 | A1 * | 3/2008 | Bowen | 341/22 |
| 2008/0088600 | A1 * | 4/2008 | Prest et al. | 345/173 |
| 2008/0129552 | A1 * | 6/2008 | Wigdor | 341/22 |
| 2008/0158024 | A1 * | 7/2008 | Steiner et al. | 341/34 |
| 2008/0204478 | A1 * | 8/2008 | Hung | 345/663 |
| 2008/0263568 | A1 * | 10/2008 | Kusuda et al. | 719/320 |
| 2008/0318635 | A1 * | 12/2008 | Yoon et al. | 455/566 |
| 2009/0055453 | A1 * | 2/2009 | Wiggeshoff | 708/145 |
| 2009/0115644 | A1 * | 5/2009 | Hsieh | 341/23 |
| 2009/0278820 | A1 * | 11/2009 | Fourquin et al. | 345/184 |
| 2009/0280860 | A1 * | 11/2009 | Dahlke | 455/556.1 |
| 2009/0303204 | A1 * | 12/2009 | Nasiri et al | 345/184 |

FOREIGN PATENT DOCUMENTS

| | | |
|---|---|---|
| EP | 1 213 899 A2 | 6/2002 |
| EP | 1 640 689 A2 | 3/2006 |
| GB | 2 378 878 A | 2/2003 |
| JP | 2001094636 | 4/2001 |
| JP | 2001136259 | 5/2001 |
| JP | 200216945 A | 1/2002 |
| JP | 2002-164990 | 6/2002 |
| JP | 2002199443 | 7/2002 |
| JP | 2003005879 | 1/2003 |
| JP | 2004228688 | 8/2004 |
| JP | 2004318826 A | 11/2004 |
| WO | WO 99/46909 | 9/1999 |
| WO | WO 00/34965 | 6/2000 |
| WO | WO 2005/027550 A1 | 3/2005 |

OTHER PUBLICATIONS

Sazawal et al., "The Unigesture Approach (One-Handed Text Entry for Small Devices)," F. Paterno (Ed.): Mobile HCI 2002, LNCS 2411, pp. 256-270, 2002.

MIT Technology Review, Nov. 2003.

Wigdor et al., "TiltText: Using Tilt for Text Input to Mobile Phones," ACM UIST Nov. 2, 2003, p. 81-90.

Wigdor, Daniel J., "Chroding and Tilting for Rapid, Unambiguous Text Entry to Mobile Phones," A thesis submitted in conformity with the requirements of the degree of Masters of Science, Graduate Department of Computer Science, University of Toronto.

International Search Report for 04800494.9—2210 PCT/US2004036179.

Vibha Sazawal et al., "The Unigestrure Approach: One-Handed Text Entry for Small Devices," Mobile HCI, LNCS 2411, Springer-Verlag, Dec. 31, 2002, pp. 256-270, XP002480984 Berlin, Heidelberg ISBN: 978-3-540-44189-2.

Mackenzie S., "KSPC (Keystrokes per Character) as a Characteristic of Text Entry Techniques," Lecture Notes in Computer Science, Springer Verlag, Berlin, DE, vol. 2411, Sep. 1, 2002, pp. 195-210, XP008081784 ISSN: 0302-9743.

Partridge K. et al., "Tilttype Accelerometer-Supported Text Entry for Very Small Devices," UIST 02. Proceedings of the 15$^{th}$ Annual ACM Symposium on User eInterface Software and Technology. Paris, France, Oct. 27-30, 2002; [ACM Symposium on User Interface Software and Technology], New York, NY: ACM, US, vol. Conf. 15, Oct. 27, 2002, pp. 201-204, XP001171582, ISBN: 978-1-58113-488-9.

* cited by examiner

Figure 9:
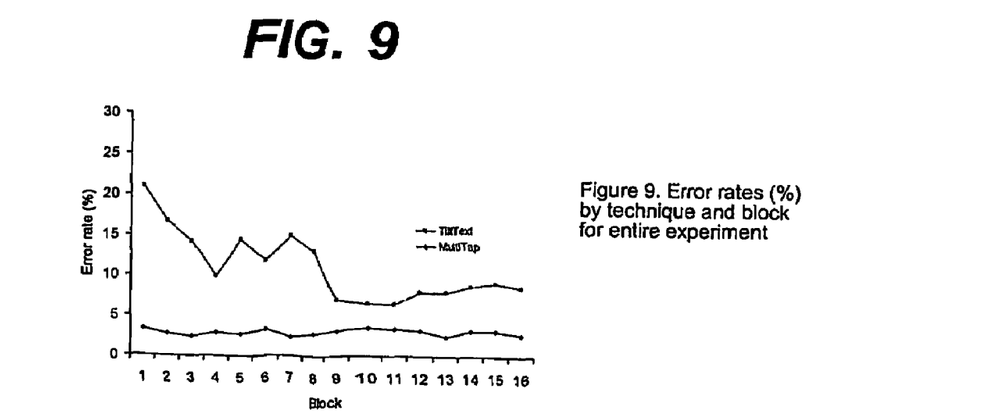

Figure 9. Error rates (%) by technique and block for entire experiment

FIG. 10

Figure 10:
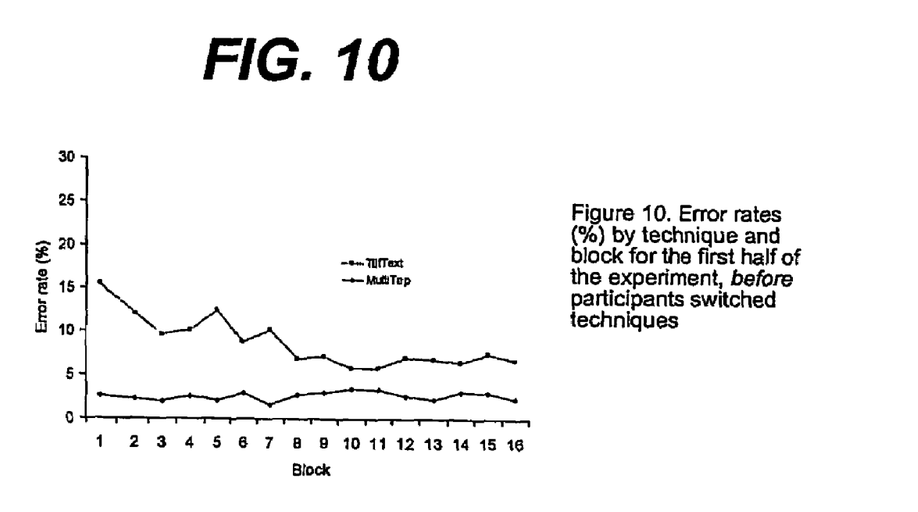

Figure 10. Error rates (%) by technique and block for the first half of the experiment, *before* participants switched techniques

CONCURRENT DATA ENTRY FOR A PORTABLE DEVICE

PRIORITY

The present application claims priority to U.S. Provisional Patent Application No. 60/516,385, filed on Oct. 31, 2003, titled "Concurrent Data Entry for a Portable Device," the entire disclosure of which is incorporated by reference herein.

FIELD

The present invention relates to data entry on a portable device, and more particularly, to a system and method of concurrent data entry for a portable device, such as a mobile phone.

BACKGROUND OF THE INVENTION

Figure 1:
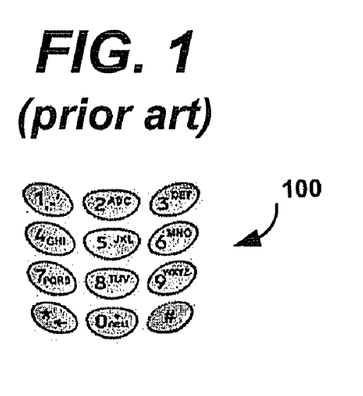

Most mobile phones are equipped with a simple 12-button keypad, similar to the keypad 100 shown in FIG. 1. Such a keypad is an inherently poor tool for generating phrases for a 26-letter alphabet. Using traditional text-entry techniques, such as MultiTap, an average text message of 7 words requires roughly 70 key presses. The GSM Association (www.gsmworld.com) estimates that in 2003, nearly 500 billion text messages will be sent worldwide from mobile phones. Using current text-entry techniques, this would require approximately 35 trillion key presses. While research has gone into devising a variety of more efficient text input techniques, none has yet emerged as a new standard.

Entering text from the 26 character English alphabet (or practically any other Roman alphabet) using the standard 12-key (0-9, *, #) mobile phone keypad forces a mapping of more than one character per key. The typical mapping has keys 2-9 representing either three or four alphabetic characters in addition to the numerals. All text input techniques that use this standard keypad have to somehow resolve the ambiguity that arises from this multiplexed mapping. The problem may be characterized as involving two main tasks necessary for entering a character: between-group selection of the appropriate group of characters, and within-group selection of the appropriate character within the previously chosen group. Most text input techniques to date can generally be divided into two categories: those that require multiple presses of a single key to make between-group followed by within-group selections, and those that require a single press of multiple keys to make these selections. Because both categories require consecutive key presses, the research focus has been on reducing the average number of key strokes per character ("KSPC") required to enter text. Advances in the area generally make language specific assumptions to "guess" the desired within-group character, thus reducing or eliminating the key presses required for the within-group selection. The success of these techniques, however, is based almost entirely on how closely the text entered conforms to the underlying language model. Given that text entered on mobile phones often involves significant abbreviations and even evolving new "languages" by frequent users of SMS messaging, making language assumptions may not be the best approach to solving the text input problem.

A small number of mobile phones today utilize QWERTY style keypads that enable text entry with techniques similar to typing on a regular keyboard, albeit at a much smaller physical scale (e.g., the Nokia 5510, www.nokia.com). More recently, hybrid devices that combine phones with Personal Digital Assistants ("PDAs"), such as the Handspring Treo (www.handspring.com) and PocketPC Phone (www.microsoft.com), utilize pen-based text input techniques common to PDA's such as Palm's Graffiti (www.palm.com). While these devices are making small inroads into the mobile phone market, the vast majority of mobile phones are equipped with the standard keypad, which has 12 keys: 0-9, *, and #.

Entering text from a 26 character alphabet using this keypad forces a mapping of more than one character per button of the keypad. A typical mapping has keys 2-9 representing either three or four characters, with space and punctuation mapped to the other buttons. All text input techniques that use this standard keypad have to somehow resolve the ambiguity that arises from this multiplexed mapping. There are three main techniques for overcoming this ambiguity: MultiTap, two-key, and linguistic disambiguation.

1. MultiTap

MultiTap works by requiring the user to make multiple presses of each key to indicate which letter on that key is desired. For example, the letters pqrs traditionally appear on the "7" key. Pressing that key once yields "p", twice "q", etc. A problem arises when the user attempts to enter two consecutive letters on the same button. For example, tapping the "2" key three times could result in either "c" or "ab". To overcome this, MultiTap employs a time-out on the button presses, typically 1-2 seconds, so that not pressing a button for the length of the timeout indicates that you are done entering that letter. Entering "ab" under this scheme has the user press the "2" key once for "a", wait for the timeout, then press "2" twice more to enter "b". To overcome the time overhead this incurs, many implementations add a "timeout kill" button that allows the user to skip the timeout. If we assume that "0" is the timeout kill button, this makes the sequence of button presses to enter "ab": "2-0-2-2". MultiTap eliminates any ambiguity, but can be quite slow, with a keystrokes per character (KSPC) rate of approximately 2.03. (See MacKenzie, I.S. (2002). KSPC (keystrokes per character) as a characteristic of text entry techniques. *Fourth International Symposium on Human-Computer Interaction with Mobile Devices.* p. 195-210.)

2. Two-Key Disambiguation

The two-key technique requires the user to press two keys in quick succession to enter a character. The first keypress selects the appropriate group of characters, while the second identifies the position of the desired character within that group. For example, to enter the character "e", the user presses the "3" key to select the group "def", followed by the "2" key since "e" is in the second position within the group. This technique, while quite simple, has failed to gain popularity for Roman alphabets. It has an obvious KSPC rate of 2.

3. Linguistic Disambiguation

There are a number of linguistic disambiguation schemes that utilize knowledge of the language to aid the text entry process. One example is T9 (see www.tegic.com), which renders all possible permutations of a sequence of button presses and looks them up in a dictionary. For example, the key sequence "5-3-8" could indicate any of 27 possible renderings (3×3×3 letters on each of those keys). Most of these renderings have no meaning, and so are rejected. Looking each of them up in a dictionary tells the system that only "jet" is an English word, and so it is the one rendered. Ambiguity can, however, arise if there is more than one valid rendering in the language, in which case the most common is presented. For example, the sequence "6-6" could indicate either "on" or "no". If the system renders the wrong word, a "next" key allows the user to cycle through the other valid permutations. An analysis of this technique for entering text from an English corpus found a KSPC close to 1 (see MacKenzie, I.S. (2002) "KSPC (keystrokes per character) as a characteristic of text entry techniques," *Fourth International Symposium on Human-Computer Interaction with Mobile Devices*, pp. 195-210). Newer linguistic disambiguation techniques such as LetterWise and WordWise (see www.eatoni.com) also perform similarly well, with subtle advantages over earlier techniques. While these all have excellent KSPC rates, the success of linguistic-based systems depends on the assumption that users tend to enter "English-like" words when sending text messages. However, users often use abbreviations and incomplete English when text messaging. Further, users of text messaging often communicate in acronyms or combinations of letters and numbers (e.g., "b4" for "before"). Another problem with these linguistic techniques is that users have to visually monitor the screen in order to resolve potential ambiguities, whereas the MultiTap and two-key techniques can be operated "eyes-free" by skilled users.

Using Tilt Sensors in Portable Devices

Attempts have been made to incorporate tilt sensors in portable devices. Unigesture uses tilt as an alternative to button pressing, eliminating the need for buttons for text entry. (See Sazawal, V., Want, R., & Borriello, G. (2002), "The Unigesture Approach. One-Handed Text Entry for Small Devices," *Mobile HCI*, p. 256-270.) Rather than having the user make one of 8 ambiguous button presses (as is the present case with mobile phones), Unigesture has the user tilt the device in one of 7 directions to specify the group, or "zone", of the character that is desired. The ambiguity of the tilt is then resolved by using dictionary-based disambiguation.

TiltType combines button pressing and tilt for entering unambiguous text into a small, watch-like device with 4 buttons. (See Partridge, K, Chatterjee, S., Sazawal, V., Borriello, G., & Want, R. (2002), "TiltType: accelerometer-supported text entry for very small devices," *ACM UIST Symposium on User Interface Software and Technology*, pp. 201-204.) Pressing a button triggers an on-screen display of the characters that can be entered by tilting the device in one of eight directions. The user then makes the appropriate tilt and releases the button.

Chording Keyboards

Chording keyboards typically have a series of chording keys that can be used in conjunction with a keypad to enter text. Two-handed chorded keyboards have been used by the U.S. postal service for mail sorting, and are still used today by stenographers. The Twiddler (see www.handykey.com) and the Septambic Keyer (see wearcam.org/septambic/) are examples of modem-day one-handed chording keyboards. Designed to be held in the hand while text is being entered, both are commonly used as part of a wearable computer. The Twiddler is equipped with 6 keys to be used with the thumb, and 12 for the fingers, while the traditional Septambic Keyer has just 3 thumb and 4 finger switches. The Septambic Keyer allows for 47 different combinations of key presses, while the Twiddler allows over 80,000, though not all keys are used for text entry.

None of the approaches described above have been commercially successful. What is needed is an efficient system and method for entering data into a numeric keypad of a portable device.

DETAILED DESCRIPTION

In view of the wide variety of embodiments to which the principles of the present invention can be applied, it should be understood that the illustrated embodiments are exemplary only, and should not be taken as limiting the scope of the present invention.

Figure 2:
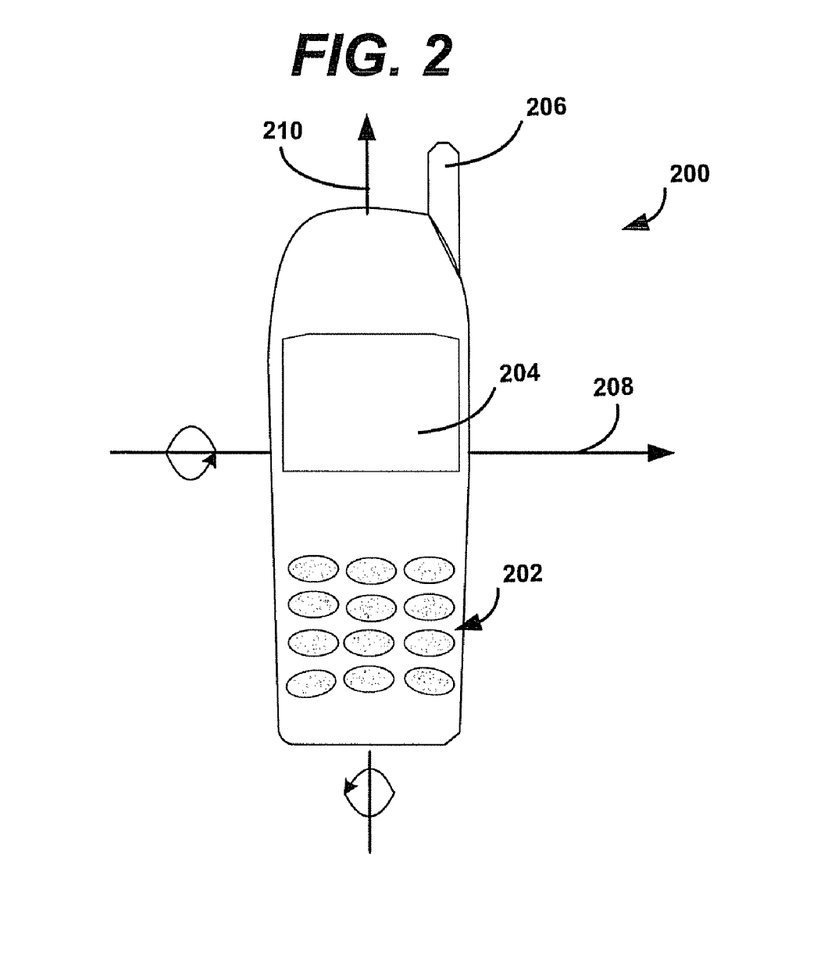

FIG. 2 is a pictorial representation of a mobile phone 200 according to an exemplary embodiment of the present invention. The phone 200 includes a 12-button keypad 202, a display 204, and an antenna 206. The phone 200 is also likely to include a microphone and speaker, which are not shown in FIG. 2.

A user may tilt the phone 200 along a first axis 206 and/or a second axis 208 to assist in entering text data into the phone 200. By determining the tilt of the phone 200 as the user is pressing a button on the keypad 202, the phone 200 is able to combine a first concurrent input (button press) with a second concurrent input (tilt status) to identify an entered character. Thus, the number of unique characters that may be entered is greater than the number of buttons (and the number of detectable tilt states).

In a preferred embodiment, the first and second axes 208 and 210 are chosen so that as a user holds the phone 200 with the display 204 facing the user, the first axis 208 runs through the left and right sides of the phone 200, so that rotation about the first axis 208 produces a forward and backward tilt. The second axis 210 preferably runs through the top and bottom of the phone 200, so that rotation about the second axis 210 produces a side-to-side tilt. Selecting the axes 208 and 210 in this way, as opposed to selecting an axis coming perpendicular out of the face of the phone 200, will allow the user to generally view correctly oriented text on the display 204 (i.e., the text will generally run horizontally from the user's frame of reference). Rotation about an axis coming perpendicular out of the face of the phone 200 would require the user to read text at an angle. Comfort and ease of operation may also help in determining the axes of rotation.

In most embodiments, the amount of tilt required for disambiguation is selected so that the user will still be able to easily view the keypad and display at all tilted states. Therefore, while a 90 degree tilt to the left may be detected as a disambiguating tilt, a more reasonable minimum tilt might be 5-10 degrees, with an average expected tilt of about 30 degrees. The amount of tilt should be large enough to avoid erroneous disambiguation, but small enough to promote comfort, speed, and ease in viewing the display and keypad.

Figure 3:
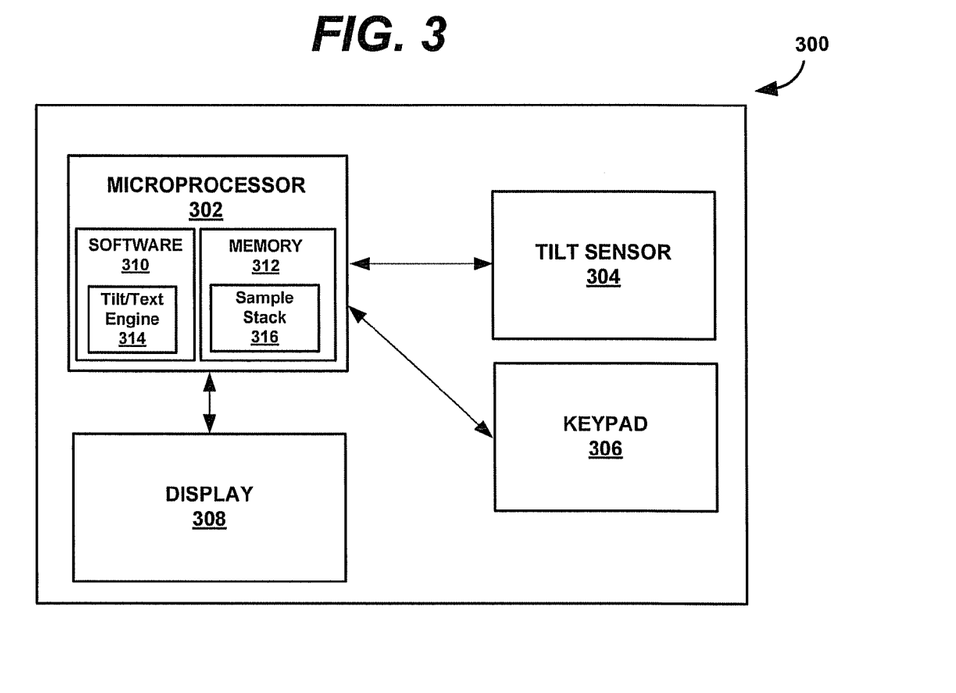

FIG. 3 is a simplified block diagram illustrating a system 300 for concurrent data entry in a portable device, such as a mobile phone. The system 300 includes a microprocessor 302 having connections to a tilt sensor 304 and a keypad 306. The system also includes a display 308 to allow a user to view entered text and other information, such as a message received from another mobile user.

The microprocessor 302 operates using software 310 and memory 312. The software 310 preferably runs on an operating system associated with the system 300, such as a mobile phone operating system. The software may include one or more modules such as a tilt/text engine 314 operable to identify entered data by using tilt and button presses as inputs. The software may be written in Java, C++, or any other suitable language.

The memory 312 may include a sample record stack 316 to store a recent samples obtained by the microprocessor 302 from the tilt sensor 304. This may be useful in determining tilt relative to previous orientations, such as if a relative tilt implementation is used. A relative tilt embodiment is described in greater detail below. The number of samples to be stored in the sample record stack 316 will likely depend on a number of factors, including the available memory, the sampling rate, and possibly a user defined setting that may be changed as the user becomes more proficient (and quicker) entering data using button presses concurrently with tilt.

In an alternative embodiment, the tilt sensor 304 could make use of a digital camera, such as one contained in a "camera phone" to help in determining tilt. For example, by identifying a visual pattern in a first image and identifying how the visual pattern has changed in a second or other subsequent image, the change in orientation (or tilt) of the system 300 may be determined. This alternative technique may be useful in an environment subject to underlying background accelerations that might be perceived as accelerations (or tilts) by the tilt sensor 304. For example, a user entering data on an accelerating bus may observe effects due to the tilt sensor sensing acceleration from the bus in addition to acceleration from an intentional tilt.

Figure 14:
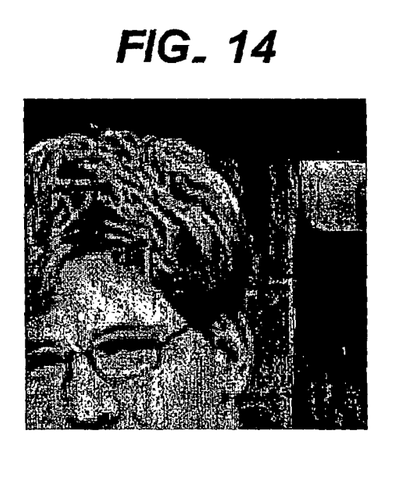
Figure 15:
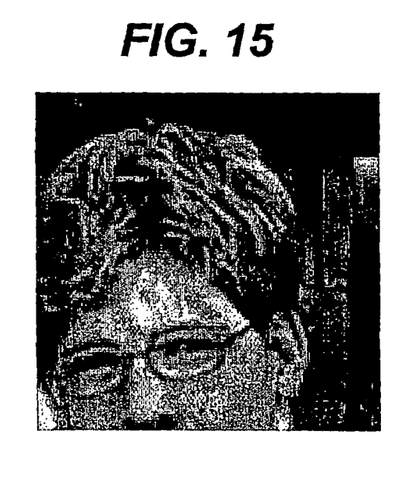

FIGS. 14 and 15 illustrate a technique for using computer vision to determine tilt. Using a camera built-in to a mobile phone, tilting can be detected without the need of an accelerometer. By monitoring shifts in the camera's visual field, tilting and panning movements can be inferred: shifts in the image indicate a shift in the camera's position, but in the opposite direction. In FIG. 15, the image within the visual field of the camera has shifted to the right, when compared to FIG. 14. This indicates a left lateral move of the camera, from which subtle tilting gestures can be inferred.

While the embodiment of FIG. 3 makes use of software for a majority of operations, a hardware or firmware implementation could also be used. For example, a series of AND/OR gates implemented with transistors and/or programmable logic circuitry.

Figure 4:
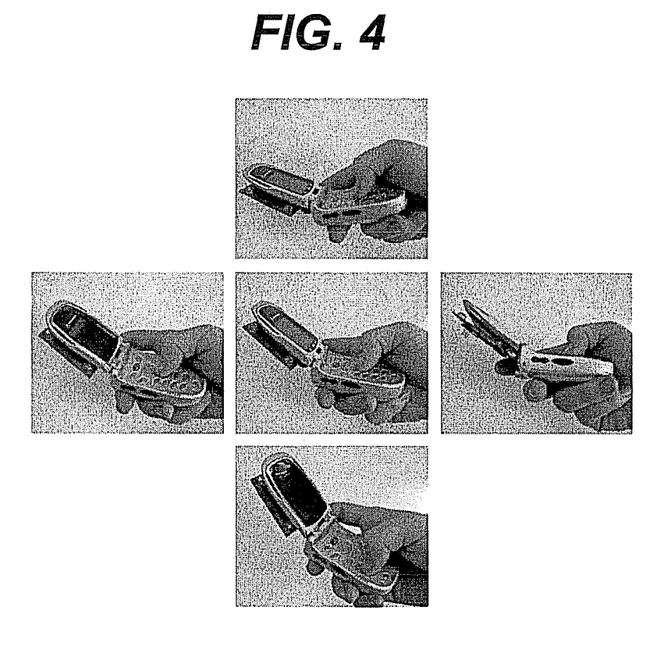

FIG. 4 is a series of pictorial diagrams illustrating an exemplary embodiment for determining tilt in a system for concurrent data entry in a mobile phone. The series of figures show one possible combination of tilt axes that may be used to disambiguate the meaning of button presses. Tilting the phone to the left (left diagram) selects the first letter of the button, tilting the phone away from the body (top diagram) selects the second letter of the button, tilting to the right (right diagram) selects the third letter, and, if a fourth letter is present on the button, tilting towards the user's body (bottom diagram) selects the fourth letter. Pressing a key without tilting (center diagram) results in entering the numeric value of the key. Space and backspace operations may be carried out by pressing unambiguous single-function buttons.

Figure 5:
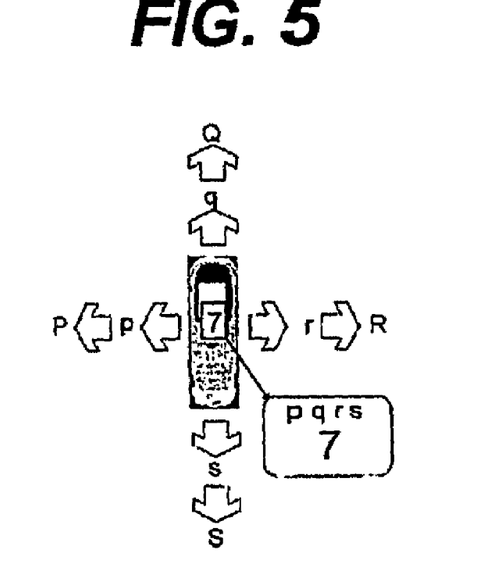

Supporting both lowercase and uppercase characters would require a further disambiguation step since a total of seven characters per key would need to be mapped for keys 2-6 and 8, and nine characters each for the 7 and 9 keys. Adding case sensitivity could be done by either requiring the pressing of a "sticky" shift-key, or considering the magnitude of the tilt as a disambiguator where greater magnitude tilts result in upper case letters. FIG. 5 illustrates the latter of these two techniques for the "7" key and the letters "P", "Q", "R", and "S" on a mobile phone. Eyes-free entry, however, would likely be more difficult using the technique shown in FIG. 5, since the user may wish to confirm that a large enough tilt was used to realize a capital letter.

The system uses the standard 12-button mobile phone keypad augmented with a low-cost tilt sensor. The system uses a combination of a button press and tilting of the device to determine the desired letter. This technique differs from TiltType (Partridge et al. (2002), "TiltType: accelerometer-supported text entry for very small devices," *ACM UIST Symposium on User Interface Software and Technology*, pp. 201-204.) in the size of the device, the type of keypad used, ease of one-handed operation, and in the sensing algorithms, described in detail below. The standard phone keypad mapping assigns three or four alphabetic characters and one number to each key. For example, the "2" key also has the characters "a", "b", and "c" assigned to it. The system assigns an additional mapping by specifying a tilt direction for each of the characters on a key, removing any ambiguity from the button press. The user presses a key while simultaneously tilting the phone in one of four directions (left, forward, right, back) to input the desired character. For example, pressing the "2" key and tilting to the left inputs the character "a", while tilting to the right inputs the character "c". By requiring only a single keypress and slight tilt to input alphanumeric characters, the overall speed of text entry can be increased. Further, unlike some techniques that improve on the status quo MultiTap technique, the system is not language dependent, and thus can be used without visually attending to the display screen.

Techniques for Calculating Tilt

The tilt of the phone is taken as whichever direction has the greatest tilt relative to an initial "origin" value. Described herein are three alternative embodiments for determining the tilt value: key tilt, absolute tilt, and relative tilt.

a. Key Tilt

In a first embodiment, the amount of tilt is calculated as the difference in the value of the tilt sensors at key down and key up. This requires the user to carry out three distinct movements once the button has been located: push the button, tilt the phone, and release the button. A similar approach has been used with a watch-like four-button device. (See Partridge, K, Chatterjee, S., Sazawal, V., Borriello, G., & Want, R. (2002), "TiltType: accelerometer-supported text entry for very small devices," *ACM UIST Symposium on User Interface Software and Technology*, pp. 201-204.) Initial experiments using a key tilt implementation on a 12-button mobile phone keypad showed that this implementation was much slower than the traditional MultiTap technique.

b. Absolute Tilt

In a second embodiment, the tilt sensor's value at any given time is compared to a "fixed" absolute origin. Only two distinct movements are required to enter a character: the phone is tilted and then a key is pressed. In contrast, the key tilt embodiment requires three movements: a key is pressed, the phone is tilted, and then the key is released.

However, users do not typically maintain a constant arm posture. Thus, in order for the tilt value to be meaningful, the fixed origin will preferably be reset every time the use's gross arm posture changes.

Further, when using the system to enter two characters requiring tilt in opposite directions, more movement is required using this absolute approach, since the first tilt must be undone, then the new tilt applied. For example, entering the letters "ac" using the "2" key requires an initial tilt of some angle $\alpha$ to the left to enter the "a". Then, the user has to tilt the same angle $\beta$ in the reverse direction to return to the origin, before tilting another angle $\beta$ to the right to enter the letter "c". The total amount of movement is $2\beta+\alpha$, instead of the smaller $\alpha+\beta$ that one may expect. However, one advantage of this embodiment over the key tilt embodiment is that if successive characters with the same tilt direction are to be entered, then the user can keep the phone tilted at that direction for the successive keypresses.

C. Relative Tilt

According to a third embodiment, tilt is calculated relative to a floating origin that is set when a tilt gesture begins. The beginning of a gesture is determined by continuously watching for a change in orientation or a change in the direction of a tilting gesture. This approach solves both problems of the absolute tilt embodiment. Since all tilts are relative to the beginning of the gesture, there is no absolute origin that need be reset when changing arm position. Further, opposite-direction tilts do not require double tilting, since the second tilt's origin is the end of the first tilt's gesture. So, entering the letters "ac" requires a tilt of some angle $\alpha$ to the left to enter a, then another tilt of angle $\beta$ to the right to enter the c, for a total movement of $\alpha+\beta$. Note that, like with the absolute tilt embodiment, when entering only letters, we can enter successive characters with the same tilt direction without re-tilting the phone, by looking at the last significant tilt.

Disambiguating Characters

Once a tilt state has been determined for a pressed button, a character associated with the pressed button may be identified by referring to a tilt menu that specifies tilt states that correspond to particular characters. The tilt menu may be, for example, a simple lookup table stored in memory. Alternatively, disambiguation may be performed in hardware, such as in dedicated logic circuitry.

Experimental Verification

To confirm that embodiments of the present invention do indeed provide speed and efficiency benefits over the current MultiTap technique, an experiment was conducted, as described below.

Hardware

A Motorola i95cl mobile phone equipped with an Analog Devices ADXL202EB-232 2-axis accelerometer board to enable tilt sensing served as the test device. The accelerometer board was connected to the phone via a serial cable (with the addition of an external power line). While a preferable commercial implementation is likely to have the tilt-sensing circuitry enclosed within the casing of the mobile phone, the external serial-cable mounting served to provide an indication of expected results.

An implementation of a relative tilt system would require regular sampling from the tilt sensor. Because the experimental hardware provided for a reliable sampling rate of only approximately 10 Hz, an absolute tilt approach to tilt determination was used. To implement a relative tilt technique, at least a 20-50 Hz sampling rate should be used.

Under the absolute tilt experimental setup, the user was allowed to reset the origin at any time by holding the phone at the desired orientation and pressing "0". The additional movement required by this approach, however, was believed to be acceptable for evaluation purposes because if the experimental system performed well despite this additional movement, then any more robust implementation using a relative tilt approach would likely only perform better. In other words, the evaluation was biased against the experimental system.

Because the ADXL board was able to detect a tilt of only fractions of a degree, only a very small tilt of the phone was necessary to disambiguate a button press. The maximum of the tilt in either axis was taken to be the intended tilt, with a 10% bias towards forward/back. This bias was included due to a tendency of users to pitch to the dominant side when tilting forward with the wrist.

Software

The software to read tilts and render text, as well as conduct the experiment, was written in Java 2 Micro-Edition using classes from both the Mobile Devices Information Profile (MIDP 1.0) and proprietary i95cl specific classes.

The experiment was conducted entirely on the mobile phone rather than simulating a mobile phone keypad on some other device. All software, including those portions implementing the text entry techniques and data presentation and collection ran on the phone. No connection to an external computing device beyond the tilt sensor was used.

The MultiTap implementation set up for comparison used the i95cl's built-in MultiTap engine, with a 2 second timeout and timeout kill. We only considered lowercase text entry in this evaluation. As such, the MultiTap engine was modified slightly to remove characters from the key mapping that were not on the face of the button, so that the options available were only the lower case letters and numeral on the key.

Procedure

Experiment participants (5 men and 5 women of whom 3 were left-handed and 7 right-handed, none of which had any experience composing text using either technique) entered short phrases of text selected from among those in MacKenzie's English phrase dictionary (see www.yorku.ca/mack/phrases2.txt). The desired text phrases were shown to participants on the screen on the phone.

Timing began when participants entered the first character of the phrase, and ended when the phrase was entered completely and correctly. If an erroneous character was entered, the phone alerted the user by vibrating, and the user was required to correct their error. With this procedure, the end result was error-free in the sense that the correct phrase was captured. Also, the phrase completion time incorporates the time taken to correct for errors.

Before beginning each treatment, participants were told to read and understand the displayed phrase before entering it, and were given instructions for that treatment as follows:

MultiTap instructions: to enter a character using the MultiTap technique, first find the key that is labeled with that character. Press that key repeatedly until the desired character is reached. Press once for the first character, twice for the second, three times for the third, and, if present, four times for the fourth. Once you have found the correct letter, and are ready for the next one, you simply repeat the process. If the letter you wish to enter next is on the same key, you must first either press the "right" arrow on the phone or wait two seconds for the cursor to advance.

Experimental system instructions: the technique works by tilting the phone in the direction of the letter you wish to enter, then pressing the key on which it is inscribed. For the first letter, tilt left. For the second letter, tilt forward. For the third letter, tilt to the right. For the fourth letter, tilt towards you. The direction of tilt is measured relative to the "centre" or "origin" position of the phone. You can reset the origin at any time by pressing the "0" key.

The experimenter then demonstrated the relevant technique. To ensure that participants understood how the technique worked, they were asked to enter a single phrase that would require tilting in all four directions for the experimental system, or two successive letters on the same key for MultiTap.

Additional instructions were given for both techniques to describe space and delete keys, as well as to enter an extra space at the end of the phrase to indicate completion. The process for error correction was also explained to them. Participants were also directed to rest as they liked between phrases, but to continue as quickly as possible once they had started entering a phrase.

Results

The data collected from 10 participants took an average of 10.3 minutes per block. A total of 145360 correct characters of input were entered for the 6400 phrases.

Text Entry Speed

We use the standard wpm (words-per-minute) measure to describe text entry speed. This is traditionally calculated as characters per second *60/5. Because timing in our experiment started only after entering the first character, that character was not included in calculations of entry speed. Thus, for the purposes of these computations, the length of a phrase is n−1 characters. Also, to signify completion, users had to enter an extra space at the end of each phrase. However, entry of the last real character of the phrase was considered to be the end time.

The average text entry speed for all blocks were 11.76 wpm and 10.11 wpm for the experimental system and MultiTap respectively. Overall, the system was 16.3% faster than MultiTap.

The means for the first block of trials were 7.42 wpm and 7.53 wpm, for the system and MultiTap respectively. Performance in both techniques increased steadily, with the means for the last ($16^{th}$) block of trials of 13.57 wpm for the system and 11.04 wpm for MultiTap. While subjects performed marginally better with MultiTap initially, they improved considerably faster with the experimental system, with the spread between the techniques reaching 22.9% in favor of the experimental system by the end of the experiment.

Figure 6:
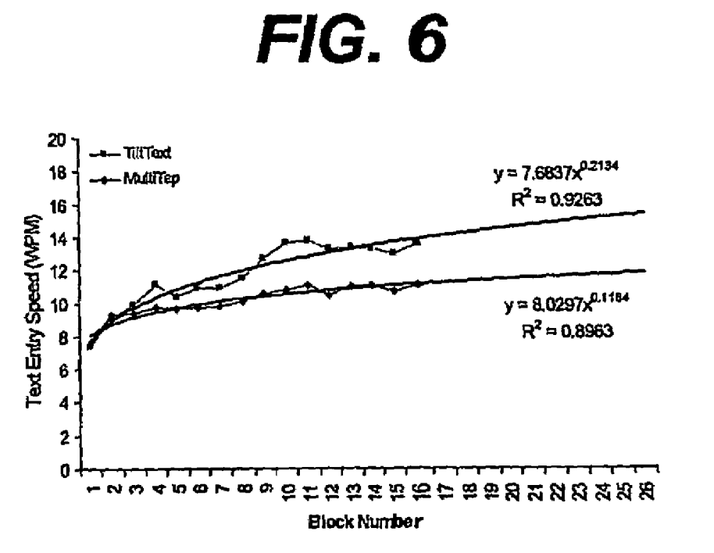

Analysis of variance indicated significant main effects for technique ($F_{1,8}$=615.8, p<0.0001), and block ($F_{15,120}$=145.2, p<0.0001). There was also a significant technique×block interaction ($F_{15,120}$=20.5, p<0.0001), indicating that participants improved at different rates for the different techniques. FIG. 6 illustrates these effects.

Figure 7:
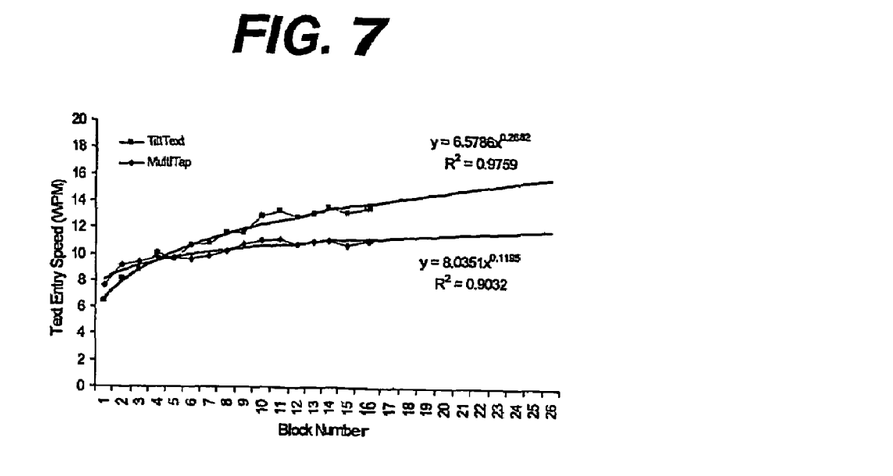

From our analysis and FIG. 7, we see that without prior experience with either technique, the system started out performing worse than MultiTap, only crossing over at block 4. This is likely because the system required participants to master two distinctly different motor skills: pressing the key, and tilting the phone. MultiTap required only a single type of motor action: multiple presses of the key.

Figure 8:
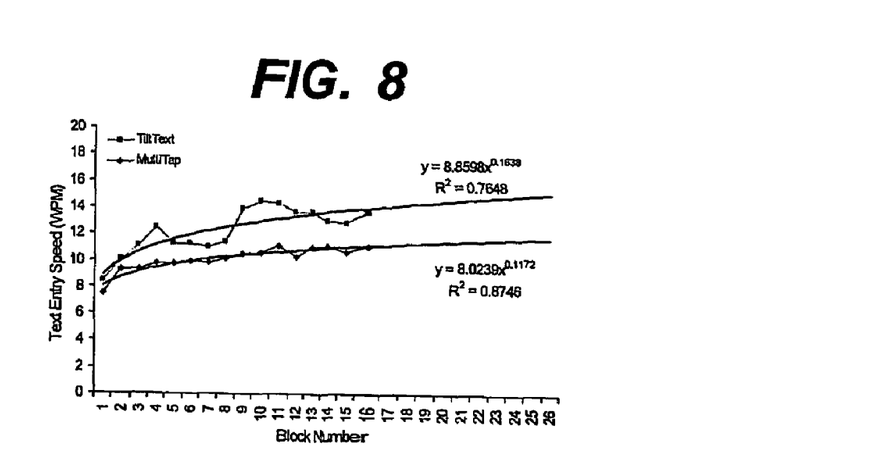

FIG. 8 shows data after participants switched techniques (i.e., the second half of the experiment). We see here that the system starts off faster than MultiTap, indicating that participants were able to take advantage of and transfer their previous experience with MultiTap in the first half of the experiment. This is a positive indication since it means that real users with lots of experience with MultiTap can transfer at least some of that skill if they switch to the experimental system. Note, however, that there is quite a bit more variability in the performance for the experimental system, as indicated by the poorer fit of the power curve as compared to FIGS. 6 and 7. This indicates that participants experienced some level of interference due to previous experience with MiltiTap.

Error Rates

Given that the experimental procedure required participants to make corrections as they proceeded, with an end result of a completely correctly entered phrase, the entry speed results discussed previously incorporate the cost of error correction. However, it is still useful to look at a more explicit error rate. We calculate percentage error rate as the number of characters entered that did not match the expected character, divided by the length of the phrase. In this case, we used the actual length of the phrase, and not (n−1) as in the wpm rate.

Overall, error rates were much higher for the experimental system (11%) than for MultiTap (3%). This effect was statistically significant ($F_{1,8}$=1378.8, p<0.0001). There was also a significant effect($F_{15,120}$=21.1, p<0.0001). A significant technique×block interaction ($F_{15,120}$23.3, p<0.0001) and FIG. 9 indicate that while the error rates for MultiTap remain quite constant throughout the experiment, the error rates for the experimental system drop rapidly over the first 8 blocks, and begin to asymptote from block 9 onwards.

As with the entry time analysis, a significant order×technique interaction ($F_{15,120}$=168.9, p<0.0001) indicates that participants exhibited asymmetric transfer effects. An analysis of the first half of the data (i.e., before participants switched techniques) indicates main effects similar to that of the entire dataset: technique ($F_{1,8}$=632.4, p<0.0001), blocks ($F_{15,120}$=7.3, p<0.0001), and technique×block interaction ($F_{15,120}$=10.4, p<0.0001), as shown in FIG. 10. Interestingly, the mean system error rate (8.6%) was lower than for the entire data set, indicating that the lack of interference from MultiTap was beneficial.

Figure 11:
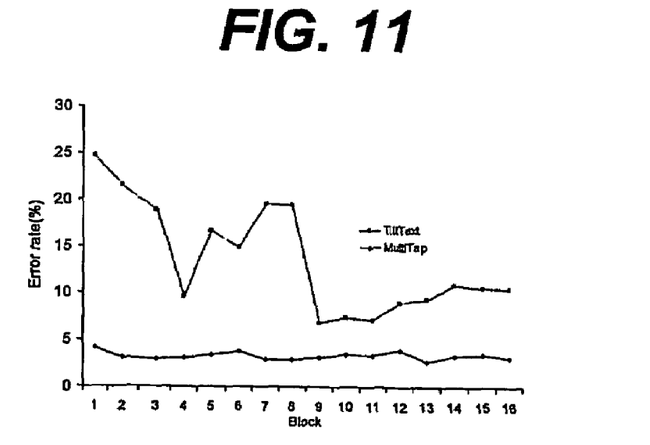

FIG. 11 illustrates the data from trials in the second half of the experiment (i.e., after participants switched techniques). Comparing this to FIG. 10, the mean the system error rate of 13.5% is much higher than the mean 8.6% rate in the first half of the experiment. Further, the first 8 blocks of trials did not exhibit a constant trend for the experimental system. Clearly, participants' previous experience with the MultiTap technique was having a detrimental effect on their ability to use the experimental system right after the switch in technique occurs. This is consistent with the effect observed in the text entry speed data illustrated earlier in FIG. 8. However, this effect wears off roughly after block 8.

To examine the cause of the higher system error rate, errors may be grouped into two categories: tilt errors and button errors. Tilt errors are those where the participant entered a letter that appears on the same button as the correct letter, indicating that an erroneous tilt was made. Button errors are those where the participant entered a letter that appeared on a different button.

We had anticipated that button errors would have similar rates for the system and MultiTap. However, the results showed a significant difference ($F_{1,8}$=320.67, p<0.0001), where 3% of characters entered in the MultiTap trials were button errors, but only 1.5% of characters entered in the experimental system showed this type of error.

Reconciling this low button error rate with the high overall error rate for the system, it is clear that most of the errors committed while using the system were tilt errors. Breaking down the tilt error rate by letter shows that participants committed significantly more errors for some letters than others ($F_{25,200}$=2.47, p<0.001), as FIG. 10 illustrates.

Figure 12:
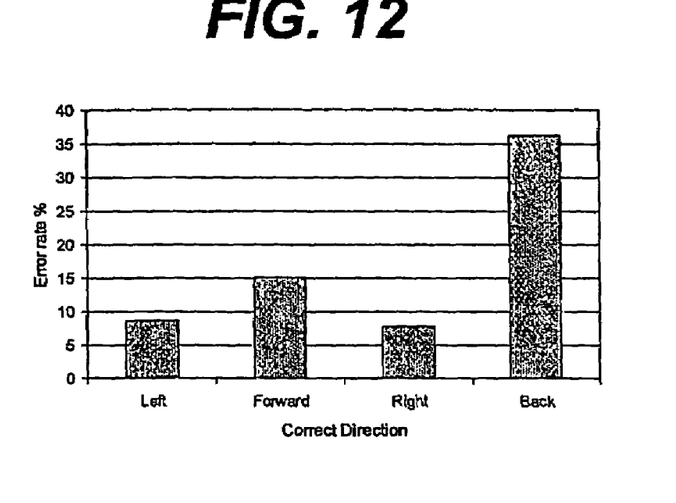

Analysis of variance showed a significant main effect for tilt direction on tilt error rate ($F_{3,24}$=37.6, p<0.0001). Pair-wise means comparisons showed a significantly higher tilt error rate for those letters requiring forward or backward tilting than those requiring right or left tilting. In particular, backwards tilt results in significantly higher errors than all the other tilt directions. FIG. 12 illustrates this trend.

Figure 13:
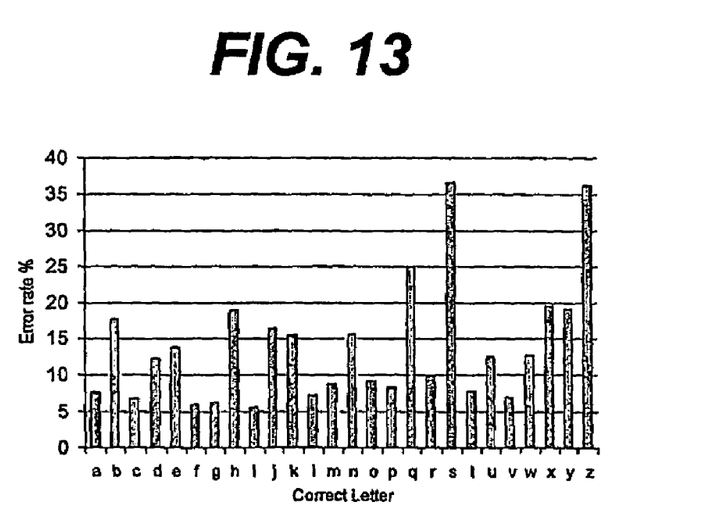

As was discussed previously, the overall system error rate decreases with practice. As such, it is possible that the high tilt error rate for backward tilt (letters "s" and "z") is due to the limited amount of practice users had with entering the letter "z", which was only entered 3 times in the experiment by each participant. However, the other letter that required backward tilting, "s", also showed a similarly high tilt error rate, despite being entered very frequently during the experiment. In other words, additional practice did not seem to decrease the backward tilt error rate significantly, indicating that users had an inherent difficulty with backward tilting actions. FIG. 13 illustrates tilt error rates as a percentage for each letter in the alphabet.

When participants committed a tilt error for a letter requiring a left or right gesture, 82% of the time they ended up entering the forward-tilt letter on that button. This indicates that the 10% bias we introduced in our algorithm seems to overcompensate. Reducing this compensation factor may lower tilt error rate for left/right tilts.

The increased error rate for forward/backward movements is possibly explained by limitations of the absolute tilt system used in our experiment Participants tended to set the origin, then have the phone slowly "creep" forward as they made far more forward than back tilting gestures. As a result, the phone was always tilted somewhat forward. This meant that an exaggerated back gesture was required to enter "s" or "z", which users often failed to accomplish on the first attempt. The tendency to hold the phone in a forward position also explains why most tilt errors resulted in entering the forward tilt letter on the same button. Due to hardware constraints, an absolute tilt implementation was used, instead of the more efficient and accurate relative tilt method. Error rates would likely be improved if relative tilt were to be used, since users would not have to tilt a specific amount past the origin between characters as required in the absolute tilt method, and they also would not have to exaggerate the back tilts to overcome the forward posture. These extra requirements are a likely cause of errors, particularly if users attempt to perform the technique quickly without watching the screen. Relative tilt would be more amenable to fast, "eyes-free" use.

The tilt angle required ranges from a little more than 0 degrees to an approximate maximum of 90 degrees. From our observations of participants in our experiment, it appears that the average tilt angle is probably around 30 degrees. With a more definitive determination of this parameter or at least a smaller bound on its range, it would be possible to develop a model that more accurately describes the system than KSPC.

We will also examine whether different tilting directions are more natural for the wrist, and perhaps replace the simplistic "left/right, back/forward" technique examined here. We will also test an implementation that groups letters to minimize the need to re-tilt between character entries.

I claim:

1. A method for disambiguating from among a plurality of characters associated with each of a plurality of buttons composing at least a portion of a 12-button keypad on a mobile phone, comprising:
   sampling mobile phone tilt along two perpendicular axes that are parallel to a front face of the mobile phone, the front face of the mobile phone having at least one of a display and the 12-button keypad, the sampling occurring at a sampling rate of at least 20 Hz;
   maintaining a sample stack indicative of continuously updated past mobile phone tilt samples corresponding to the mobile phone;
   detecting that a user has activated a button by depressing or releasing one of the plurality of buttons in the 12-button keypad on the mobile phone;
   calculating a tilt state of the mobile phone when the button is activated, by comparing a most recent mobile phone tilt to a floating origin that is set by continuously monitoring the sample stack to identify when a tilt gesture begins, the beginning of the tilt gesture corresponding to the floating origin;
   upon determining that the tilt state of the mobile phone falls within a first mobile phone tilt threshold, identifying a numeral associated with the button;
   upon determining that the tilt state of the mobile phone falls within a second mobile phone tilt threshold, identifying a first character associated with the button;
   upon determining that the tilt state of the mobile phone falls within a third mobile phone tilt threshold, identifying a second character associated with the button;
   upon determining that the tilt state of the mobile phone falls within a fourth mobile phone tilt threshold, identifying a third character associated with the button;
   displaying the identified character on the display; and
   repeating the steps of sampling, maintaining, detecting, calculating, and at least one of the determining steps for each button activated by the user in entering a string of characters.

2. The method of claim 1, further comprising upon determining that the tilt state of the mobile phone falls within a fifth mobile phone tilt threshold, identifying a fourth character associated with the first button.

3. The method of claim 1, wherein the first, second, and third characters are lower-case letters, and wherein, upon determining that the mobile phone tilt is greater than a predetermined capital threshold, identifying a capital letter associated with the first button.

4. The method of claim 1, wherein mobile phone tilt is sampled using a tilt sensor and a microprocessor, wherein the tilt sensor is part of the mobile phone.

5. The method of claim 4, wherein the tilt sensor includes at least one acceleration sensor.

6. The method of claim 4, wherein the tilt sensor includes at least one digital camera.

7. The method of claim 1, wherein the mobile phone has a left side, a right side, a top, a bottom, and a display, and wherein the display and the 12-button keypad are located on the front face of the mobile phone.

8. The method of claim 7, wherein the two axes include a first axis and a second axis, wherein the first axis runs through and is perpendicular to the left and right sides of the mobile phone, wherein the second axis runs through and is perpendicular to the top and bottom, and wherein when the front face of the mobile phone is facing the user, a mobile phone tilt to the left side along the second axis identifies the first character, a mobile phone tilt away from the user along the first axis identifies the second character, a mobile phone tilt to the right side along the second axis identifies the third character, and no mobile phone tilt identifies the numeral.

9. The method of claim 8, wherein the first, second, and third characters are letters located on the first button associated with the numeral on the 12-button keypad.

10. The method of claim 8, wherein mobile phone tilt toward the user along the first axis identifies a fourth character.

11. The method of claim 10, wherein the first, second, third, and fourth characters are letters located on the first button associated with the numeral on the 12-button keypad.

* * * * *